(12) United States Patent
Bedell et al.

(10) Patent No.: US 9,502,278 B2
(45) Date of Patent: Nov. 22, 2016

(54) SUBSTRATE HOLDER ASSEMBLY FOR CONTROLLED LAYER TRANSFER

(71) Applicant: International Business Machines Corporation, Armonk, NY (US)

(72) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 490 days.

(21) Appl. No.: 13/867,441

(22) Filed: Apr. 22, 2013

(65) Prior Publication Data

US 2014/0312094 A1   Oct. 23, 2014

(51) Int. Cl.
*H01L 21/00* (2006.01)
*H01L 21/687* (2006.01)
(Continued)

(52) U.S. Cl.
CPC ......... *H01L 21/68714* (2013.01); *B25B 5/061* (2013.01); *B25B 5/10* (2013.01);
(Continued)

(58) Field of Classification Search
CPC .............. H01L 2221/68381; H01L 2221/683; H01L 21/6875; H01L 21/6838; H01L 21/6835; H01L 21/304; H01L 21/68714; Y10T 225/10; Y10T 279/23; Y10T 279/11; B25B 5/10; B25B 5/061
USPC .............................. 438/691, 692, 689; 225/1
See application file for complete search history.

(56) References Cited

U.S. PATENT DOCUMENTS 3,617,045 A    11/1971  Da Costa
4,592,308 A    6/1986   Shih et al.
(Continued)

FOREIGN PATENT DOCUMENTS

DE          10024858 A1    11/2001
JP          2002134413     5/2002
(Continued)

OTHER PUBLICATIONS

Thornton, J.A., "Internal stresses in titanium, nickel, molybedenum, and tantalum films deposited by cylindrical magnetron sputtering", J. Vac. Sci. Technol., Jan./Feb. 1977, vol. 14, No. 1.
(Continued)

*Primary Examiner* — Omar Flores Sanchez
(74) *Attorney, Agent, or Firm* — Scully, Scott, Murphy & Presser, P.C.; Louis J. Percello, Esq.

(57) ABSTRACT

A substrate holder assembly for use in a controlled spalling process is provided. The substrate holder assembly includes a base structure having a surface in which a base substrate or other work piece can be placed thereupon. A framing element is located above and spaced apart from the surface of the base structure. The framing element has a window which exposes an upper surface of the base substrate and defines an area of the upper surface of the base substrate in which another material can be applied thereto. A support structure containing at least one mechanical securing element is located on the framing element. The support structure mechanically constrains the base substrate within the substrate holder assembly. Each mechanical securing element contacts at least one surface of the support structure and, optionally, one surface of the base substrate.

15 Claims, 5 Drawing Sheets

(51) Int. Cl.
   *B25B 11/00* (2006.01)
   *H01L 21/683* (2006.01)
   *B25B 5/06* (2006.01)
   *B25B 5/10* (2006.01)
   *H01L 21/304* (2006.01)

(52) U.S. Cl.
   CPC .......... *B25B 11/005* (2013.01); *H01L 21/304* (2013.01); *H01L 21/6835* (2013.01); *H01L 21/6836* (2013.01); *H01L 21/6838* (2013.01); *H01L 21/6875* (2013.01); *H01L 2221/683* (2013.01); *H01L 2221/68381* (2013.01); *Y10T 225/10* (2015.04); *Y10T 279/11* (2015.01); *Y10T 279/23* (2015.01)

(56) References Cited

U.S. PATENT DOCUMENTS

| | | | |
|---|---|---|---|
| 5,292,399 A | 3/1994 | Lee et al. | |
| 5,810,931 A | 9/1998 | Stevens et al. | |
| 5,842,690 A | 12/1998 | Lee et al. | |
| 6,051,122 A | 4/2000 | Flanigan | |
| 6,073,576 A | 6/2000 | Moslehi et al. | |
| 6,380,094 B1 | 4/2002 | Seidel et al. | |
| 6,753,234 B1 * | 6/2004 | Naem | 438/318 |
| 6,797,625 B2 | 9/2004 | Kim et al. | |
| 6,921,457 B2 | 7/2005 | Kisaichi | |
| 8,061,700 B2 | 11/2011 | Zhang | |
| 8,240,649 B2 | 8/2012 | Kim | |
| 8,960,686 B2 | 2/2015 | Ferguson | |
| 9,040,432 B2 * | 5/2015 | Bedell et al. | 438/759 |
| 2001/0009497 A1 * | 7/2001 | Takahasi et al. | 361/234 |
| 2003/0114009 A1 | 6/2003 | Kim et al. | |
| 2007/0063453 A1 | 3/2007 | Ishikawa et al. | |
| 2009/0243235 A1 | 10/2009 | Nobori et al. | |
| 2013/0316538 A1 * | 11/2013 | Bedell et al. | 438/691 |
| 2014/0312094 A1 * | 10/2014 | Bedell et al. | 225/1 |

FOREIGN PATENT DOCUMENTS

| | | |
|---|---|---|
| JP | 2003297812 | 10/2003 |
| WO | WO0191178 A1 | 11/2001 |

OTHER PUBLICATIONS

Office Action dated Jul. 20, 2015 received in U.S. Appl. No. 14/024,685.

Office Action dated Feb. 12, 2016 received in U.S. Appl. No. 14/024,685.

* cited by examiner

SUBSTRATE HOLDER ASSEMBLY FOR CONTROLLED LAYER TRANSFER

BACKGROUND

The present application relates to substrate fabrication and more particularly to a substrate holder assembly for use in a mechanical layer transfer process referred to as spalling.

Devices such as, for example, photovoltaic and electro-optical, that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The recent development, see, for example, U.S. Patent Application Publication No. 2010/0311250 A1 to Bedell et al., of a novel layer transfer method referred to as 'controlled spalling technology' has permitted the fabrication of low-cost, thin-film, high quality substrates by removing a surface layer from a base substrate. The thin-film substrate layers that can be removed by this controlled spalling technology can be used to 1) increase the cost per Watt value of conventional photovoltaic technology or 2) permit fabrication of novel, high-efficiency photovoltaic, electronic and opto-electronic materials that are flexible and can be used to produce new products.

SUMMARY

A substrate holder assembly for use in a controlled spalling process is provided. The substrate holder assembly includes a base structure having a surface in which a base substrate or other work piece can be placed thereupon. A framing element is located above and spaced apart from the surface of the base structure. The framing element has a window which exposes an upper surface of the base substrate and defines an area of the upper surface of the base substrate in which another material can be applied thereto. A support structure containing at least one mechanical securing element is located on the framing element. The support structure mechanically constrains the base substrate within the substrate holder assembly. The at least one mechanical securing element mechanically is mechanically coupled to at least one surface of the support structure and, optionally, one surface of the base substrate. The substrate holder assembly of the present application can be planar or curved. One advantage of the substrate holder assembly of the present application is that the integrity and deformation of the stressor layer covered base substrate can be controlled through the stressor deposition, handle application and controlled spalling stages.

One aspect of the present application relates to a substrate holder assembly which can hold a work piece such as, for example, a base substrate, in place during a subsequently performed process, such as a material layer transfer process. The substrate holder assembly of the present application includes a base structure having a surface in which a work piece can be placed thereupon. The substrate holder assembly further includes a framing element located above and spaced apart from the surface of the base structure by a thickness of the work piece. The framing element has a window which exposes an upper surface of the work piece. The substrate holder assembly further includes a support structure containing at least one mechanical securing element and located on the framing element. The at least one mechanical securing element is mechanically coupled to at least one surface of the support structure.

Another aspect of the present application relates to a method of removing a material layer from a base substrate utilizing a spalling process. This aspect of the present application includes confining a base substrate within a substrate holder assembly. The substrate holder assembly includes a base structure having a surface in which the base substrate can be placed thereupon. The substrate holder assembly further includes a framing element located above and spaced apart from the surface of the base structure by a thickness of the base substrate. The framing element has a window which exposes an upper surface of the work piece. The substrate holder assembly further includes a support structure containing at least one mechanical securing element and located on the framing element. The at least one mechanical securing element is mechanically coupled to at least one surface of the support structure. After confining the base substrate to the substrate holder assembly, a stressor layer is formed atop the exposed surface of the base substrate. Next, a material layer of the base substrate is removed by spalling, wherein the material layer is attached to at least the stressor layer. In some embodiments, the base substrate remains confined within the substrate holder assembly during the steps of forming a stressor layer and spalling. In other embodiments, after forming the stressor layer, the confined base substrate is held in placed by applying an external force to the confined base substrate and thereafter, and while maintaining the external force to the base substrate, the at least one mechanical securing element is disengaged and then the support structure and framing element are removed. Thereafter, spalling is performed.

DETAILED DESCRIPTION

The present application will now be described in greater detail by referring to the following discussion and drawings that accompany the present application. It is noted that the drawings of the present application are provided for illustrative purposes and, as such, they are not drawn to scale. In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

As used herein, a controlled spalling process is a layer transfer technology that uses mechanically guided fracture to separate a surface layer from a base substrate. The spalling process works by first forming a stressor layer, e.g., a Ni layer, on a surface of a base substrate. A handle substrate is then attached to the surface of the stressor layer. By using the handle layer to initiate and guide the fracture front that forms below the upper surface of the base substrate, a simple and robust layer transfer process can be achieved.

The present application provides a substrate holder assembly which can secure the base substrate during the stressor layer deposition and, optionally during the fracture propagation stage. The substrate holder assembly of the present application can serve one or more of the following functional roles: (1) control the base substrate curvature, (2) control stressor coverage and, (3) integrate the stressor-covered substrate with the handle layer applicator and fracture process. Prior to the present application, there existed no known substrate holder assembly for securing base substrates that satisfy the above mentioned functional roles.

The substrate holder assembly of the present application is now discussed in further detail with reference to FIGS. 1A and 1B which illustrate exemplary substrate holder assemblies in accordance with the present application. In accordance with the present application, the substrate holder assembly includes a base structure 50 having a surface 51 in which a work piece 54 can be placed thereupon. The substrate holder assembly further includes a framing element 56 located above and spaced apart from the surface of the base structure 50 by a thickness of the work piece 54. That is, the framing element 56 of the substrate holder assembly of the present application is disjoined, i.e., not necessarily contacting any surface of the base structure 50. The framing element 56 has a window which exposes an upper surface 55 of the work piece 54; in the embodiment to follow the work piece 54 is a base substrate 12 and a portion of an upper surface 11 of the base substrate 12 would be left exposed after placing the framing element 56 thereon. The substrate holder assembly further includes a support structure 58 containing at least one mechanical securing element 60 and located on the framing element 56. The at least one securing element 60 is mechanically coupled to at least one surface of the support structure 58. The support structure 58 includes an opening therein which permits an upper surface of the work piece 54 to be left exposed such that further processing may be performed on the exposed upper surface of the work piece 54.

In some embodiments of the present application, the substrate holder assembly may be planar. The term "planar" when used in conjunction with the substrate holder assembly denotes that the surface 51 of base structure 50 is a flat surface with no deliberate curvature. In other embodiments of the present application, the substrate holder assembly may be curved. The term "curved" when used in conjugation with the substrate holder assembly denotes that the surface 51 of base structure 50 has a spatially-dependent height displacement with respect to a reference location on the surface 51 of base structure 50. Examples of curvature include convex or concave spherical curvature, cylindrical curvature, parabolic curvature or any other spatially varying surface displacements.

The substrate holder assembly can have any number of geometries. For example, the substrate holder assembly can be circular, rectangular, or polygonal. Other geometries can be also be used for the substrate holder assembly.

The base structure 50 of the substrate holder assembly is employed in the present application to hold (i.e., secure) a work piece during a subsequently performed process. In one embodiment, the base structure 50 can be used to hold a base substrate during a subsequently performed controlled spalling process. The base structure 50 that can be employed in the present application typically includes a rigid (i.e., non-flexible) surface in which a work piece 54 can be placed thereon. Examples of base structures 50 that can be employed in the present application include; metal, ceramic, glass or polymer plates. These materials may also possess features that provide a means of mechanically securing the work piece 54 to the base structure 50 independently of the framing element 56 and support structure 58. For example, the base structure 50 may serve as the whole or part of a vacuum chuck, or an electrostatic chuck. When a vacuum chuck is employed as the base structure 50, the vacuum chuck may contain a plurality of vacuum through holes which extend from one surface of the base structure 50 to an opposing surface of the base structure 50. The role of the vacuum through holes is to permit transfer of a vacuum to the bottom surface of work piece 54. Likewise, the vacuum chuck may utilize porous metals (e.g., Al) or porous ceramics to transfer vacuum to the bottom surface of work piece 54. The base structure 50, particularly the upper surface thereof, can be composed of any metal including, for example, stainless steel, INVAR®, KOVAR® or aluminum. In some embodiments, the base structure 50, particularly the upper surface thereof, can be composed of stainless steel.

The base structure 50 may have any of the geometries mentioned above for the substrate holder assembly of the present application. The base substrate 50 typically has a width and length which are larger than the width and length of the work piece 54 that is applied thereto. As such, and when a work piece 54 is placed upon a surface of base substrate 50, a portion of the base structure 50 remains exposed. The exposed portion of the base substrate is located around the perimeter of the work piece 54.

In some embodiments of the present disclosure, a complaint layer 52 can be interposed between the bottom surface of work piece 54 and the base structure 50. The compliant layer 52 that can be employed in some embodiments of the present application is an elastic material having a Young's modulus that is less than that of the base structure 50. Young's modulus, also known as the tensile modulus or elastic modulus, is a measure of the stiffness of an elastic material. Young's modulus is defined as the ratio of the uniaxial stress over the uniaxial stain in the range of stress in which Hooke's law applies. In one embodiment, the compliant layer 52 that can be employed in the present application has a Young's modulus from 50 kPa to 5 GPa. In another embodiment, the compliant layer 52 that can be employed in the present application has a Young's modulus from 100 kPa to 500 MPa. When the compliant layer 52 is deformed due to an external force, it experiences internal forces that oppose the deformation and restore it to its original state if the external force is no longer applied.

As stated above, the compliant layer 52 that can be formed interposed between the base structure 50 and the bottom surface of work piece 54 comprises a deformable material. In one embodiment of the present application, the complaint layer 52 is comprised of an elastomer. In some embodiments of the present application, the compliant layer 52 may comprise multiple layers of elastomer materials. An elastomer is a polymer with viscoelasticity, generally having low Young's modulus and high yield strain compared with other materials. Each of the monomers which link to form the polymer is typically made of carbon, hydrogen, oxygen and/or silicon. Elastomers are amorphous polymers existing above their glass transition temperature, so that considerable segmental motion is possible. Examples of elastomers that can be employed in the present application as the compliant layer 52 include, but are not limited to, natural or synthetic rubbers, silicones, polyolefins, polyvinyl acetate, polymethyl acrylate, viscoelastic gels or foams. In some embodiments of the present application, the compliant layer 52 can be a tape such as those described herein below for use as the handle layer.

In other embodiments of the present application, the compliant layer 52 may contain a plurality of pores or arrays of small holes when support structure 50 includes a vacuum chuck. The role of the pores is to permit transfer of vacuum to the bottom surface of work piece 54.

The compliant layer 52 may have any of the geometries mentioned above for the substrate holder assembly of the present application. The compliant layer 52 typically has a width and length which is the same or even less than that of the width and length of the base structure 50.

The compliant layer 52 can be formed interposed between the base structure 50 and the bottom surface of work piece 54 by hand or by mechanical means. In some embodiments, the compliant layer 52 can be formed by dip coating, spin-coating, and/or brush coating. Typically, the complaint layer 52 is formed/applied onto a surface of the base structure 50 and then the work piece 54 can be applied to the compliant layer 52. In some embodiments, the compliant layer 52 can be formed/applied on the bottom surface of the work piece 54 prior to placing the work piece 54 on the surface of the base structure 50. In one embodiment of the present application, the compliant layer 52 has a thickness from 10 µm to 5 mm. In another embodiment of the present application, the compliant layer 52 has a thickness from 25 µm to 500 µm. Other thicknesses that are greater than or lesser than the aforementioned ranges can also be used as the compliant layer 52.

The work piece 54 that is placed above the base structure 50 and optionally the compliant layer 52 is not limited to any one material. For example, the work piece 54 can include a semiconductor material, a dielectric material, a conductive material, and/or a ceramic material. In one embodiment, the work piece 54 is a base substrate (to be defined in greater detail herein below) in which a material layer thereof can be removed by a mechanical layer transfer process referred to as spalling.

The substrate holder assembly further includes a framing element 56 located above and spaced apart from the surface of the base structure 50 by a thickness of the work piece 54. The framing element 56 has a window which exposes an upper surface 55 of the work piece 54. The framing element 56 is placed upon outer portions of the upper surface of the work piece 54 and provides a border which surrounds an area of the upper surface of the work piece 54 in which other material layers can be formed directly thereon. That is, the framing element 56 can be used in the present application to define the area of the work piece 54 in which additional processing can be performed.

The framing element 56 can have any geometry including one of the geometries mentioned above for the substrate holder assembly. In some embodiments, the framing element 56 can have an outmost vertical edge that is vertical coincident with the outmost vertical edge of the work piece 54. In other embodiments, the framing element 56 can have an outmost vertical edge that extends beyond the outmost vertical edge of the work piece 54. In such an embodiment, the framing element 56 can have an outmost vertical edge that is vertical coincident with the outmost vertical edge of the base structure 50. In embodiments in which the framing element 56 has an outmost vertical edge that extends beyond the outmost vertical edge of the work piece 54, a gap 59 such as shown in the drawings is present between the bottom surface of the framing element 56 and the upper surface of the base structure 50.

In one embodiment, the framing element 56 can be comprised of stainless steel. In another embodiment, the framing element 56 can be comprised of a conductive elastomer. The term "conductive elastomer" when used in conjugation with the framing element 56 denotes any polymeric substance that provides electrical connection between the surface of the work piece 54 and support structure 58 or base structure 50. Examples of conductive elastomers that can be employed as framing element 56 include, but are not limited to, elastomers that contain conductive additives, particles or nanostructures such as metal, conductive metal oxides, carbon, nanowires, and etc. The elastomeric materials can be any polymer such as natural or synthetic rubbers, silicones, fluoropolymers, polyolefins and the like. The use of a conductive elastomer as the framing element 56 is particularly useful when electroplating is used to deposit stressor layer 18 onto work piece 54. In this embodiment, the conductive elastomer permits electrical connection between the surface of work piece 54 and the support structure 58 and/or base structure 50, while simultaneously sealing the remaining portions of the surface of work piece 54 from the electroplating bath. The conductive elastomer can permit current flow isotropically, or anisotropically. In one embodiment, a class of z-axis conductive elastomer is used as framing element 56 that permits electrical conduction in the direction of the thickness of the framing element 56, but not in the width or length directions. Use of this type of conductive elastomer permits electrical connection to the surface or work piece 54, but inhibits electrodeposition of a stressor material on the exposed sidewall of the elastomer. In yet another embodiment, the framing element may be comprised of a plastic, a metal, or a ceramic.

In one embodiment of the present application, the framing element 56 has a thickness from 1 micron to 2 mm. In another embodiment of the present application, the framing element 56 has a thickness from 10 microns to 500 microns. Other thicknesses that are greater than or lesser than the aforementioned ranges can also be used as the framing element 56.

The framing element 56 is placed upon the upper surface of the work piece 54 by hand or by any mechanical means such as, for example, a robot arm. As mentioned above, a portion of the framing element 56 may extend beyond the vertical edges of the work piece 54.

The substrate holder assembly further includes a support structure 58 containing at least one mechanical securing element 60 and located on the framing element 56. The support structure 58 may include one of the materials mentioned above for the base structure 50. The support structure 58 has the same geometry and same dimensions as the base structure 50. The support structure 58 includes an opening (i.e., window) such that a portion of the upper surface of the work piece remains available for subsequent processing. In one embodiment of the present application, the support structure 58 has a thickness from 500 microns to 2 cm. In another embodiment of the present application, the support structure 58 has a thickness from 1 mm to 1 cm. Other thicknesses that are greater than or lesser than the aforementioned ranges can also be used as the support structure 58.

As mentioned above, the support structure 58 contains at least one mechanical securing element 60 thereon. In one embodiment, a singular mechanical securing element 60 can be employed. In yet another embodiment of the present application, a plurality of mechanical securing elements 60 can be employed. Each mechanical securing element 60 is mechanically coupled to at least one surface of the support structure 58. In one embodiment, each mechanical securing element 60 contacts an upper surface of the support structure 58. In another embodiment, each mechanical securing element 60 contacts a bottom surface of the support structure 58. In yet another embodiment, each mechanical securing element 60 contacts an upper surface of the support structure 58 and a portion of each mechanical securing element 60 extends entirely through the support structure 58. In some embodiments, another portion of each mechanical securing element 60 may extend partially within or entirely through the framing element 56. In some embodiments, a portion of each mechanical securing element 60 may contact a surface of the either the complaint layer 52 or the base structure 50.

For example, and in one embodiment, a portion of each mechanical securing element 60 may contact an upper surface of the base structure 50. In another embodiment, a portion of each mechanical securing element 60 may wrap around sidewall surfaces of the base structure 50 and contact a bottom surface of the base structure 50.

Each mechanical securing element 60 may comprise a same or different type of mechanical securing element. Typically, each mechanical securing element 60 comprises a same type of mechanical securing element. Illustrative types of mechanical securing elements that may be used in the present application include, but are not limited to, a screw, a clamp, magnetic coupling, pressure based devices, i.e., vacuum channels, or gravitational means. When magnetic coupling is employed, magnets of a first polarity can be formed/applied to either an upper or a bottom surface of the support structure 58 and other magnets having a second polarity which is the same as the first polarity are formed/applied to an upper surface of base structure 50. In one example, the entirety of the support structure 58 and base structure 50 comprise a magnetic couple that provides clamping force to the work piece 54. In yet another embodiment, the base structure 50 and the support structure 58 comprise a mechanically coupled pair. In this embodiment the base structure 50 itself can rotate, screw, or snap into the support structure 58.

The substrate holder assembly described above can be used in various applications. In one example, the substrate holder assembly can be used to hold a base substrate during a mechanical layer transfer process known as spalling. Such a process is now described in greater detail.

Figure 2A:
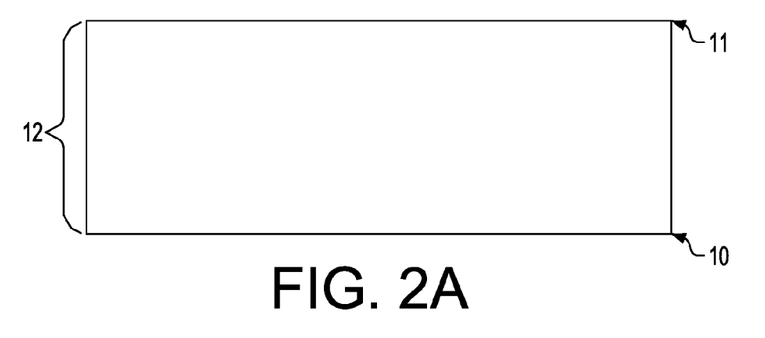
FIG. 2A is a pictorial representation (through a cross sectional view) illustrating a base substrate having an upper surface and a bottommost surface that can be employed in one embodiment of the present application.

Referring first to FIG. 2A, there is shown a base substrate 12 having an upper surface 11 and a bottom surface 10 that can be employed in one embodiment of the present application. As shown, the upper surface 11 (which may also be referred to as a first surface) of base substrate 12 is opposite the bottom surface 10 (which may also be referred herein as a second surface) of base substrate 12.

The base substrate 12 that can be employed in the present application may comprise a semiconductor material, a glass, a ceramic, or any another material whose fracture toughness is less than that of the stressor layer to be subsequently formed. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

When the base substrate 12 comprises a semiconductor material, the semiconductor material may include, but is not limited to, Si, Ge, SiGe, SiGeC, SiC, Ge alloys, GaSb, GaP, GaN, GaAs, InAs, InP, AlN and all other III-V or II-VI compound semiconductors. In some embodiments, the base substrate 12 is a bulk semiconductor material. In other embodiments, the base substrate 12 may comprise a layered semiconductor material such as, for example, a semiconductor-on-insulator or a semiconductor on a polymeric substrate. Illustrated examples of semiconductor-on-insulator substrates that can be employed as base substrate 12 include silicon-on-insulators and silicon-germanium-on-insulators. In some embodiments, base substrate 12 comprises a multilayered stack of semiconductor materials. An illustrated example of such a base substrate is a multilayered stack of from bottom to top, a layer of germanium, and a layer of gallium arsenide. When the base substrate 12 comprises a semiconductor material, the semiconductor material can be doped, undoped or contain doped regions and undoped regions.

In one embodiment, the semiconductor material that can be employed as the base substrate 12 can be single crystalline (i.e., a material in which the crystal lattice of the entire sample is continuous and unbroken to the edges of the sample, with no grain boundaries). In another embodiment, the semiconductor material that can be employed as the base substrate 12 can be polycrystalline (i.e., a material that is composed of many crystallites of varying size and orientation; the variation in direction can be random (called random texture) or directed, possibly due to growth and processing conditions). In yet another embodiment of the present application, the semiconductor material that can be employed as the base substrate 12 can be amorphous (i.e., a non-crystalline material that lacks the long-range order characteristic of a crystal). Typically, the semiconductor material that can be employed as the base substrate 12 is a single crystalline material.

When the base substrate 12 comprises a glass, the glass can be a $SiO_2$-based glass which may be undoped or doped with an appropriate dopant. Examples of $SiO_2$-based glasses that can be employed as the base substrate 12 include undoped silicate glass, borosilicate glass, phosphosilicate glass, fluorosilicate glass, and borophosphosilicate glass.

When the base substrate 12 comprises a ceramic, the ceramic can be any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present application, one or more devices including, but not limited to, transistors, capacitors, diodes, BiCMOS, resistors, etc. can be processed on and/or within the base substrate 12 utilizing techniques well known to those skilled in the art. An upper region of the base substrate 12 which may include the one or more devices can be removed utilizing a mechanical layer transfer process known as spalling. The upper region of the base substrate 12 may also include one or more III-V compound semiconductor layers which can be used as a photovoltaic device.

In some embodiments of the present application, the upper surface 11 of the base substrate 12 can be cleaned prior to further processing to remove surface oxides and/or other contaminants therefrom. In one embodiment of the present application, the upper surface 11 of the base substrate 12 is cleaned by applying to the upper surface 11 of the base substrate 12 a solvent such as, for example, acetone and isopropanol, which is capable of removing contaminates and/or surface oxides from the upper surface 11 of the base substrate 12.

In some embodiments of the present application, the upper surface 11 of the base substrate 12 can be made hydrophobic by oxide removal prior to use by dipping the upper surface 11 of the base substrate 12 into hydrofluoric acid. A hydrophobic, or non-oxide, surface provides improved adhesion between said cleaned surface and certain stressor layers to be deposited.

Figure 2B:
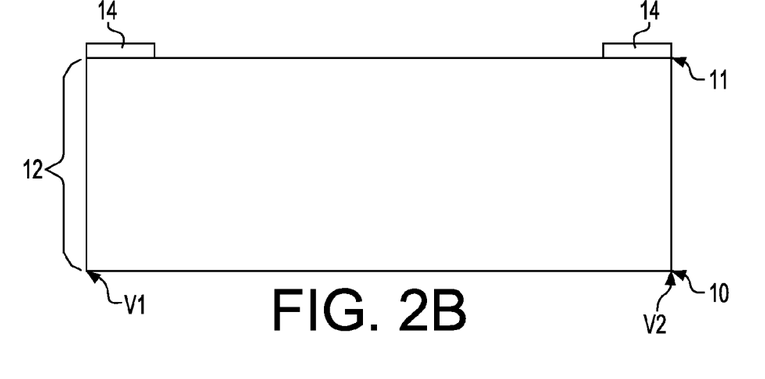
FIG. 2B is a pictorial representation (through a cross sectional view) illustrating a base substrate such as shown in FIG. 2A which also includes an edge exclusion material at the edges of the base substrate in accordance with another embodiment of the present application.

Referring to FIG. 2B, there is illustrated the base substrate 12 after forming an edge exclusion material 14 on the upper surface 11 and at the vertical edges V1, V2 of the base substrate 12 which can be employed in another embodiment of the present. As shown, the edge exclusion material 14 has one edge that is vertical coincident with vertical edge V1,V2 of the base substrate 12, while another edge of the edge exclusion material 14 is located inward from edge V1,V2 and on the upper surface 11 of the base substrate 12. The term "edge exclusion region" is used throughout the present application to denote an area atop the base substrate 12 in which a subsequently formed stressor layer is either not present or if, present, the stressor layer does not significantly adhere to the upper surface 11 of the base substrate 12. The formation of the edge exclusion material 14 minimizes edge-related substrate breakage during spalling.

In one embodiment of the present application, the edge exclusion material 14 can be an adhesion demoter. By "adhesion demoter" it is meant any material that reduces the ability of a subsequently formed optional metal-containing adhesion layer or stressor layer to adhere, i.e., stick, to the upper surface 11 of the base substrate 12. The adhesion demoters that can be employed in the present application as the edge exclusion material 14 include, but are not limited to, photoresist materials, polymers, hydrocarbon materials, inks, powders, pastes or non-adherent metals. In one embodiment, the adhesion demoter that can be employed in the present application as the edge exclusion material 14 is an ink.

The photoresist materials that can be employed as the adhesion demoter include any well known positive-tone materials and/or negative-tone materials. The polymers that can be employed as the adhesion demoter include, but are not limited to, natural polymers such as rubbers, shellac, cellulose, synthetic polymers such as nylon, polyethylene and polypropylene, deposited or applied in the form of tape or film. The hydrocarbon materials that can be employed as the adhesion demoter include, but are not limited to, saturated hydrocarbons (i.e., alkanes), unsaturated hydrocarbons (i.e., alkenes or alkynes), cycloalkanes, and aromatic hydrocarbons (i.e., arenes). Inks that can be employed as the adhesion demoter include, but are not limited to, alcohol or water-based inks commonly found in commercial permanent markers or inks used in bubble-jet printing technology. Non-adherent metals that can be employed as the adhesion demoter include, but are not limited to, Au, Ag, solders or low-melting point alloys. Pastes that can be employed as the adhesion demoter include, but are not limited to, metal based pastes, partially-cured epoxies, vacuum grease or similar materials.

The adhesion demoters that can be employed in the present application as the edge exclusion material 14 can be formed onto the upper surface 11 of the base substrate 12 near edges V1, V2 utilizing techniques that are well known in the art. For example, the adhesion demoters that can be employed in the present application as the edge exclusion material 14 can be formed by chemical vapor deposition, plasma enhanced chemical vapor deposition, atomic layer deposition, spin-coating, brushing, spray coating, screen-printing, bubble-jet printing, or fabric-tip application. In some embodiments in which inks are employed as the adhesion demoters, the ink can be applied from a pen or marker containing the same. In one embodiment, the edge exclusion material 14 has a width, which is determined from one sidewall edge to another sidewall edge, of from 0.01 mm to 10 mm. In another embodiment, the edge exclusion material 14 has a width of from 0.1 mm to 5 mm. It is observed that the portion of the base substrate 12 that is located directly beneath the edge exclusion material 14 defines an edge exclusion region whose presence minimizes the edge related breakage during a subsequent spalling process.

Figure 1A:
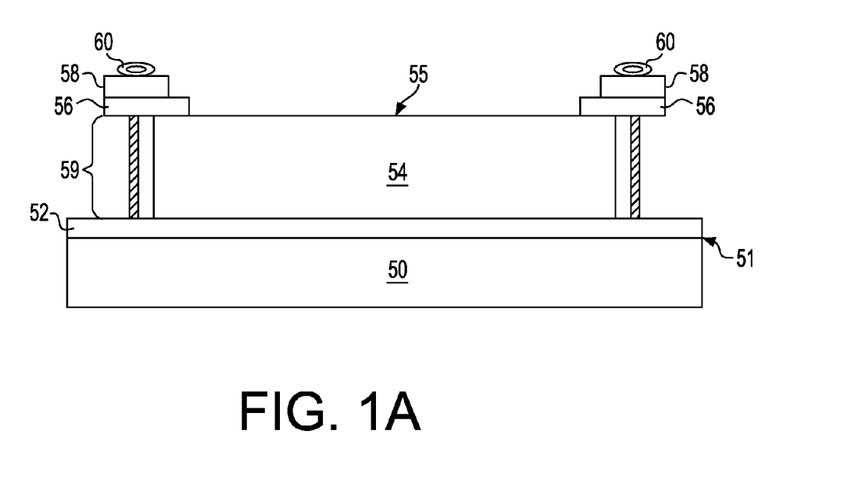
FIG. 1A is a pictorial representation (through a cross sectional view) illustrating a substrate holder assembly in accordance with one embodiment of the present application.
Figure 1B:
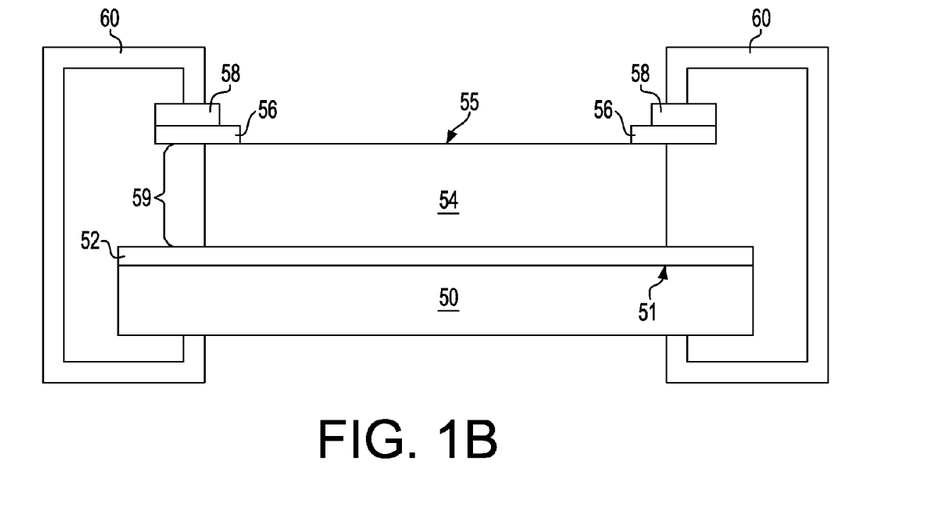
FIG. 1B is a pictorial representation (through a cross sectional view) illustrating a substrate holder assembly in accordance with another embodiment of the present application.
Figure 3:
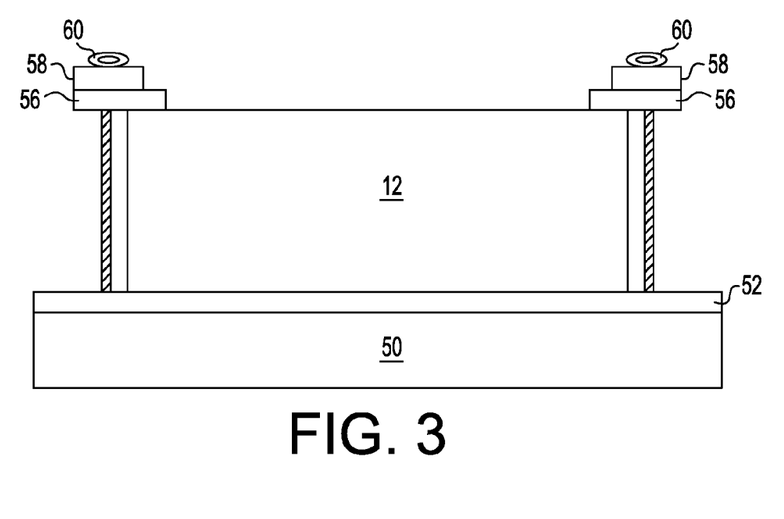
FIG. 3 is a pictorial representation (through a cross sectional view) illustrating the base structure of FIG. 2A after confining the base substrate within the substrate holder assembly of FIG. 1A.

Referring now to FIG. 3, there is illustrated the structure of FIG. 2A after confining the base substrate 12 within the substrate holder assembly of FIG. 1A. Although specific illustration is made to confining the base substrate of FIG. 2A into the substrate holder assembly of FIG. 1A, the present application also contemplates using the base substrate of FIG. 2B with the substrate holder assembly of FIG. 1A or the substrate holder assembly of FIG. 1B with the base substrate shown in FIG. 1A.

The confining of the base substrate 12 within the substrate holder assembly includes placing the base substrate 12 on a surface of the base structure 50, placing the framing element 56 on the upper surface 11 of the base substrate 12, applying the support structure 58 including the at least one mechanical securing element 60, and fastening the support structure 58 to the base structure 50 utilizing the at least one mechanical securing element 60. Fastening may be performed by tightening the securing element 60, clamping the securing element 60, or by force of attraction. When an edge exclusion material 14 is present, the framing element 56 is placed directly above the edge exclusion material 14.

Figure 4:
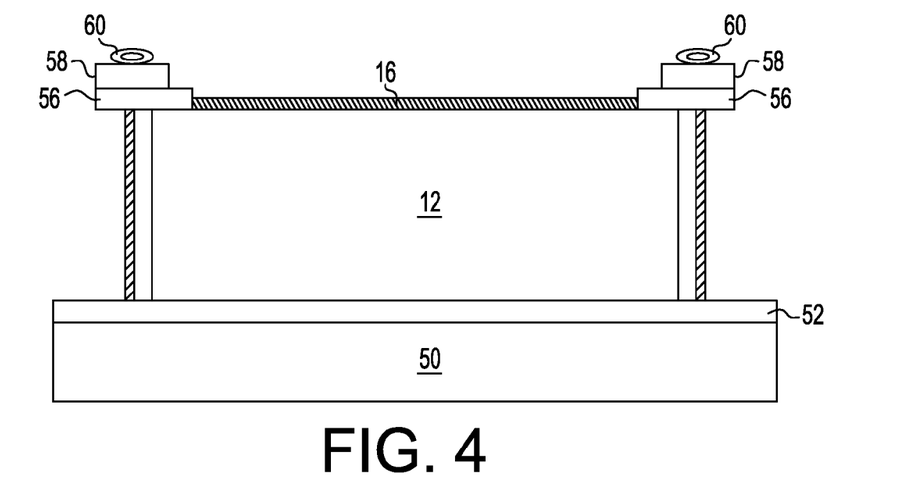
FIG. 4 is a pictorial representation (through a cross sectional view) illustrating the structure of FIG. 3 after forming a metal-containing adhesion layer on the upper surface of the base substrate in accordance with an embodiment of the present application.

Referring now to FIG. 4, there is illustrated the base substrate 12 of FIG. 3 after forming an optional metal-containing adhesion layer 16 on an exposed portion of the upper surface 11 of base substrate 12.

The optional metal-containing adhesion layer 16 is employed in embodiments in which the stressor layer to be subsequently formed has poor adhesion to upper surface 11 of base substrate 12. Typically, the metal-containing adhesion layer 16 is employed when a stressor layer comprised of a metal is employed. In some embodiments, an optional plating seed layer (not shown) can be formed directly atop the upper surface 11 of the base substrate 12. The optional plating seed layer can be used together with the metal-containing adhesion layer 16 or in lieu thereof. When the optional plating seed layer is employed in conjunction with the edge exclusion material 14, the edge exclusion material 14 is applied to the upper surface 11 of base substrate 12 prior to deposition of the plating seed layer.

The optional metal-containing adhesion layer 16 that can be employed in the present application includes any metal adhesion material such as, but not limited to, Ti/W, Ti, Cr, Ni or any combination thereof. The optional metal-containing adhesion layer 16 may comprise a single layer or it may include a multilayered structure comprising at least two layers of different metal adhesion materials.

When present, the optional metal-containing adhesion layer 16 can be formed at a temperature from 15° C. to 40° C., i.e., 288K to 313K, or above. In one embodiment, the optional metal-containing adhesion layer 16 can be formed at a temperature which is from 20° C. (293K) to 180° C. (353K). In another embodiment, the optional metal-containing adhesion layer 16 can be formed at a temperature which is from 20° C. (293K) to 60° C. (333K).

The metal-containing adhesion layer 16, which may be optionally employed, can be formed utilizing deposition techniques that are well known to those skilled in the art. For example, the optional metal-containing adhesion layer 16 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer 16 typically has a thickness from 5 nm to 300 nm, with a thickness from 100 nm to 150 nm being more typical. Other thicknesses for the optional metal-containing adhesion layer 16 that are below and/or above the aforementioned thickness ranges can also be employed in the present application.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Ti/Ni, Ti/Ag, Ti/Au, Cr/Ni, Cr/Ag, Cr/Au, Al(bottom)/Ti/Ni(top), etc. The thickness of the optional plating seed layer may vary depending on the material or materials of the optional plating seed layer as well as the technique used in forming the same. Typically, the optional plating seed layer has a thickness from 2 nm to 1 micron. The optional plating seed layer can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

In accordance with the present application, the optional metal-containing adhesion layer 16 and/or the optional plating seed layer is (are) formed at a temperature which does not effectuate spontaneous spalling to occur within the base substrate 12.

Figure 5:
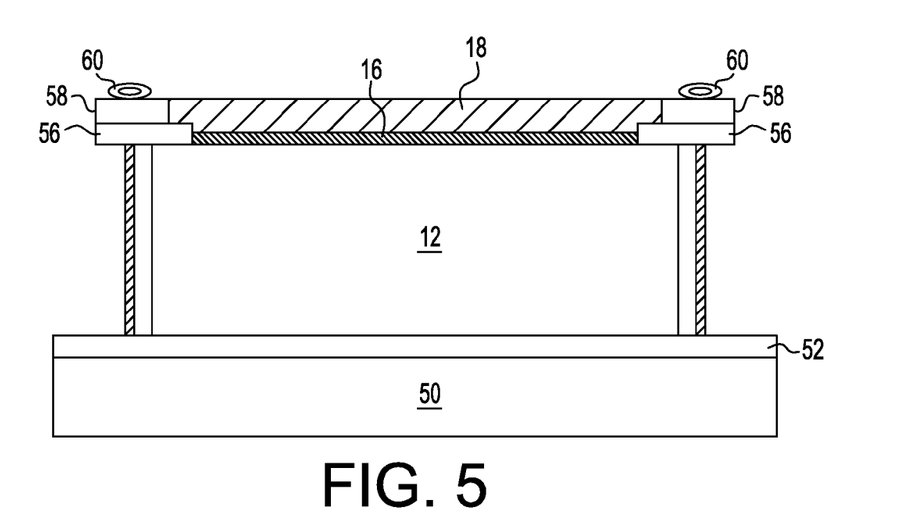
FIG. 5 is a pictorial representation (through a cross sectional view) illustrating the structure of FIG. 4 after forming a stressor layer on a surface of the metal-containing adhesion layer in accordance with an embodiment of the present application.

Referring now to FIG. 5, there is illustrated the structure of FIG. 4 after forming a stressor layer 18 on an upper surface of the optional metal-containing adhesion layer 16. In some embodiments in which the optional metal-containing adhesion layer 16 is not present, the stressor layer 18 can be formed directly on the upper surface 11 of base substrate 12; this particular embodiment is not shown in the drawings, but can readily be deduced from the drawings illustrated in the present application. In other embodiments in which an optional plating seed layer is employed, the stressor layer 18 can be formed directly on the upper surface of the optional plating seed layer; this particular embodiment is also not shown in the drawings, but can readily be deduced from the drawings illustrated in the present application.

The stressor layer 18 that can be employed in the present application includes any material that is under tensile stress on base substrate 12 after deposition. The stressor layer 18 can also be referred to a stress inducing layer. In accordance with the present application, the stressor layer 18 has a critical thickness and a stress value that cause spalling mode fracture to occur within the base substrate 12. In particular, the stressor layer 18 has a critical thickness in which spalling is initiated below the upper surface 11 of base substrate 12 and somewhere within the base substrate 12. By 'critical', it is meant that for a given stressor material and base substrate material combination, a thickness value and a stressor value for the stressor layer is chosen that render spalling mode fracture possible (can produce a $K_I$ value greater than the $K_{IC}$ of the substrate). The stress value can be adjusted by tuning the deposition conditions of the stressor layer 18. For example, in the case of sputter deposition of stressor layer 18, the gas pressure can be used to tune the stress value as described in Thorton and Hoffman, *J. Vac. Sci. Technol.*, 14 (1977) p. 164.

The thickness of the stressor layer 18 is chosen to provide the desired fracture depth somewhere within the base substrate 12. For example, if the stressor layer 18 is chosen to be Ni, then fracture will occur at a depth below the stressor layer 18 roughly 2 to 3 times the Ni thickness. The stress value for the stressor layer 18 is then chosen to satisfy the critical condition for spalling mode fracture. This can be estimated by inverting the empirical equation given by $t^*=[(2.5\times10^6)(K_{IC}^{3/2})]/\sigma^2$, where $t^*$ is the critical stressor layer thickness (in microns), $K_{IC}$ is the fracture toughness (in units of MPa·m$^{1/2}$) of the base substrate 12 and $\sigma$ is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied atop the base substrate 12 and thus can be employed as the stressor layer 18 include, but are not limited to, a metal, a polymer, such as a spall inducing tape layer, or any combination thereof. The stressor layer 18 may comprise a single stressor layer, or a multilayered stressor structure including at least two layers of different stressor material can be employed.

In one embodiment, the stressor layer 18 is a metal, and the metal is formed on an upper surface of the optional metal-containing adhesion layer 16. In another embodiment, the stressor layer 18 is a spall inducing tape, and the spall inducing tape is applied directly to the upper surface 11 of the base substrate 12. In another embodiment, for example, the stressor layer 18 may comprise a two-part stressor layer including a lower part and an upper part. The upper part of the two-part stressor layer can be comprised of a spall inducing tape layer.

When a metal is employed as the stressor layer 18, the metal can include, for example, Ni, Cr, Fe, Mo, Ti or W. Alloys of these metals can also be employed. In one embodiment, the stressor layer 18 includes at least one layer consisting of Ni.

When a polymer is employed as the stressor layer 18, the polymer is a large macromolecule composed of repeating structural units. These subunits are typically connected by covalent chemical bonds. Illustrative examples of polymers that can be employed as the stressor layer 18 include, but are not limited to, polyimides polyesters, polyolefins, polyacrylates, polyurethane, polyvinyl acetate, and polyvinyl chloride.

When a spall inducing non-metallic layer (i.e. polymeric materials such as a tape) is employed as the stressor layer 18, the spall inducing layer includes any pressure sensitive tape that is flexible, soft, and stress free at a first temperature used to form the tape, yet strong, ductile and tensile at a second temperature used during removal, i.e., spalling of an upper portion of the base substrate 12. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 12 (with a lower thermal coefficient of expansion) and the tape (with a higher thermal expansion coefficient).

Typically, the pressure sensitive tape that is employed in the present application as stressor layer 18 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 18 employed in the present application is formed at room temperature (15° C.-40° C., i.e., 288K-313K). In another embodiment, when a tape layer is employed, the tape layer can be formed at a temperature from 15° C. (288K) to 60° C. (333K).

When the stressor layer 18 is a metal or polymer, the stressor layer 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 18 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present application as stressor layer 18 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the upper surface 11 of base substrate 12, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 18 is of a metallic nature, it typically has a thickness of from 1 µm to 50 µm, with a thickness of from 4 µm to 7 µm being more typical. Other thicknesses for the stressor layer 18 that are below and/or above the aforementioned thickness ranges can also be employed in the present application.

If the stressor layer 18 is of a polymeric nature, it typically has a thickness of from 10 µm to 200 µm, with a thickness of from 50 µm to 100 µm being more typical. Other thicknesses for the stressor layer 18 that are below and/or above the aforementioned thickness ranges can also be employed in the present application.

Figure 6:
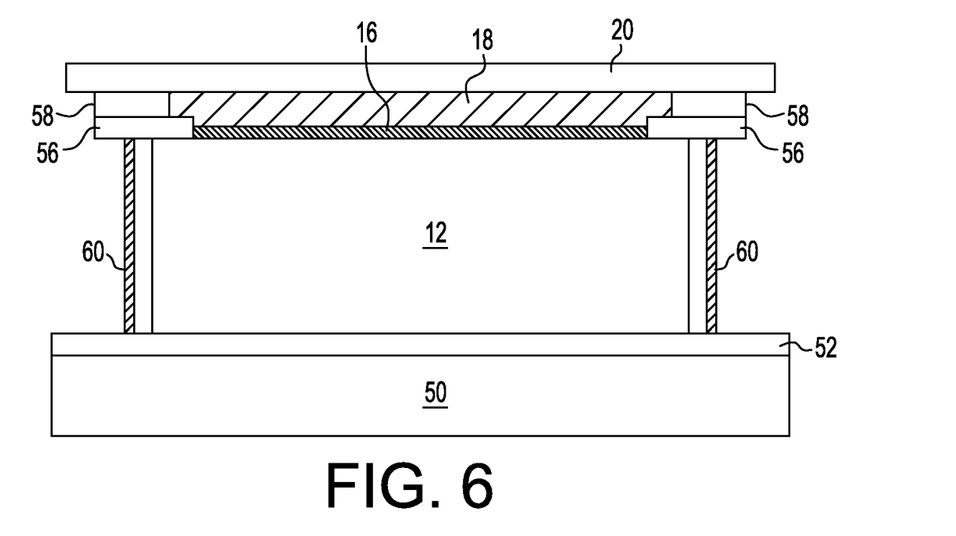
FIG. 6 is a pictorial representation (through a cross sectional view) illustrating the structure of FIG. 5 after forming a handle substrate on a surface of the stressor layer in accordance with an embodiment of the present application.

Referring to FIG. 6, there is illustrated the structure of FIG. 5 after forming a handle substrate 20 atop the stressor layer 18. The handle substrate 20 employed in the present application comprises any flexible material which has a minimum radius of curvature of less than 30 cm. Illustrative examples of flexible materials that can be employed as the handle substrate 20 include a metal foil or a polyimide foil. In some embodiments, a tape, as described above, can be used as the handle substrate 20.

The handle substrate 20 can be used to provide better fracture control and more versatility in handling the spalled portion of the base substrate 12. Moreover, the handle substrate 20 can be used to guide the crack propagation during the spalling process of the present application. The handle substrate 20 of the present application is typically, but not necessarily, formed at a first temperature which is at room temperature (15° C. (288K)–40° C. (313K)).

The handle substrate 20 can be formed utilizing deposition techniques that are well known to those skilled in the art including, for example, mechanical pressure, dip coating, spin-coating, brush coating, sputtering, chemical vapor deposition, plasma enhanced chemical vapor deposition, chemical solution deposition, physical vapor deposition, and plating.

The handle substrate 20 typical has a thickness of from 5 µm to 500 µm, with a thickness of from 10 µm to 150 µm being more typical. Other thicknesses for the handle substrate 20 that are below and/or above the aforementioned thickness ranges can also be employed in the present application. When the handle substrate 20 is a pressure sensitive tape, the adhesive layer may only be present in a region designed to overlay the area defined by framing structure 56.

Figure 8:
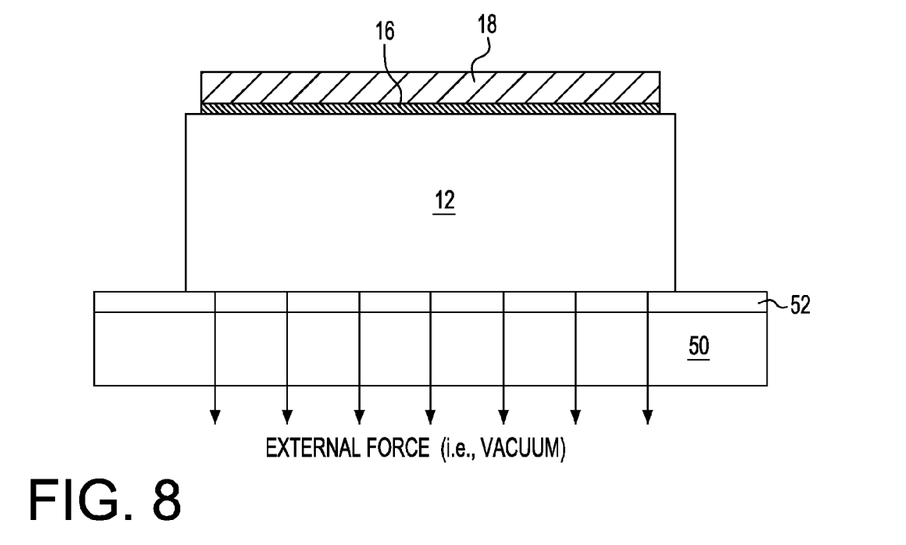
FIG. 8 is a pictorial representation (through a cross sectional view) illustrating the structure of FIG. 5 after applying an external force to the confined base substrate and removing the support structure and the framing element therefrom in accordance with another embodiment of the present application.
Figure 9:
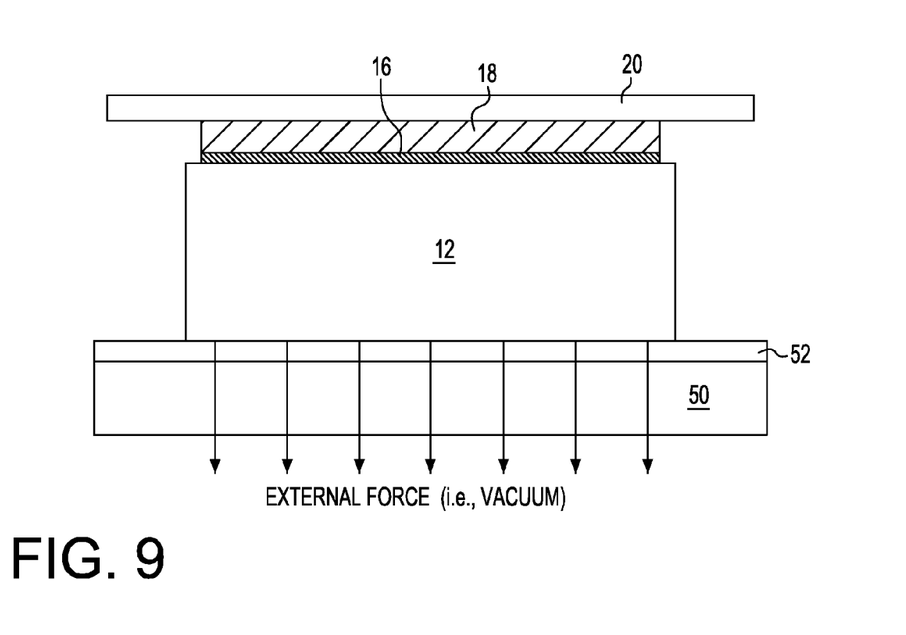
FIG. 9 is a pictorial representation through a cross sectional view) illustrating the structure of FIG. 8 after applying a handle support atop the stressor layer.

In another embodiment, support structure 58 and framing structure 56 are removed prior to forming the handle substrate 20 atop the stressor layer 18. In this embodiment, the base substrate 12 is first secured to the base structure 50 using the aforementioned independent means such as vacuum or electrostatic chucking. Once the base substrate 12 is secured, support structure 58 and framing structure 56 are detached from base structure 50. The handle substrate 20 is then formed atop stressor layer 18, and thereafter spalling is performed. This particular embodiment is illustrated in FIGS. 8 and 9 of the present application.

Figure 7:
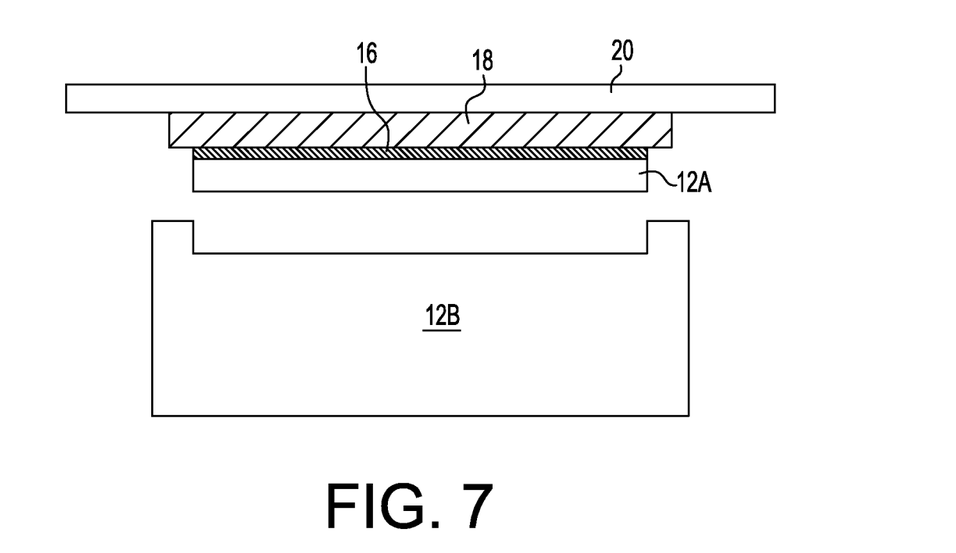
FIG. 7 is a pictorial representation (through a cross sectional view) illustrating the structure of FIG. 6 after performing a spalling process in accordance with an embodiment of the present application and removing the substrate holder assembly.

Referring to FIG. 7, there is illustrated the structure of FIG. 6 after removing an upper portion 12A of the base substrate 12 by spalling and then removing the substrate holder assembly thereof. A similar result is obtained when the structure shown in FIG. 9 is subjected spalling. In one embodiment of the present application, the spalling process includes pulling or peeling the handle substrate 20 to remove a spalled structure that includes at least the stressor layer 18 and an upper portion of the base substrate 12. The upper portion of the base substrate that is removed by spalling from the original base substrate 12 may be referred herein as a spalled material layer 12A. The remaining portion of the original base substrate 12 may be referred to herein as remaining base substrate 12B.

The spalling process includes crack formation and propagation within the base substrate 12. The spalling process is initiated at substantially room temperature (i.e., 15° C. to 40° C.). In other embodiments, spalling can be performed at a temperature from 100° C. and below. In some embodiments of the present application, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

After spalling, the support holder assembly can be removed by disengaging each mechanical securing element 60. In one embodiment, each mechanical securing element 60 can be disengaged by loosening and removing the screws. In another embodiment, each mechanical securing element 60 can be disengaged by opening the clamp. In still yet another embodiment, each mechanical securing element 60 can be disengaged by pulling apart the elements of the substrate holder assembly such that the magnets are of a sufficient distance to void the attractive force. In some embodiments in which a complaint layer 52 is employed, the compliant layer 52 can be removed from the remaining base structure 12 by releasing vacuum in the case of a vacuum chuck, or de-energizing electrical power in the case of an electrostatic chuck.

Also after spalling, handle substrate 20, stressor layer 18, and, if present the optional plating seed layer and the optional metal-containing adhesion layer 16 can be removed from the spalled material layer 12A. The handle substrate 20, the stressor layer 18, the optional plating seed layer and the optional metal-containing adhesion layer portion 16 can be removed from the spalled material layer 12A that was removed from base substrate 12 utilizing conventional techniques well known to those skilled in the art. For example, and in one embodiment, aqua regia ($HNO_3/HCl$) can be used for removing the handle substrate 20, the stressor layer 18, the optional plating seed layer, and the optional metal-containing adhesion layer 16. In another example, UV or heat treatment is used to remove the handle substrate 20 followed by a chemical etch to remove the stressor layer 18, followed by a different chemical etch to remove the optional plating seed layer, and optional metal-containing adhesion layer 16.

The thickness of the spalled material layer 12A that is removed from the base substrate 12 varies depending on the material of the stressor layer 18 and the material of the base substrate 12 itself. In one embodiment, the spalled material layer 12A that is removed from the base substrate 12 has a thickness of less than 100 microns. In another embodiment, the spalled material layer 12A that is removed from the base substrate 12 has a thickness of less than 50 microns.

In some embodiments in which an edge exclusion material is present at the edges of the base substrate, the spalled structure will also include edge exclusion material located atop and adjacent to the spalled material layer 12A of base substrate 12. Such a spalled structure would look similar to the spalled structure shown, for example, in FIG. 7. In this embodiment, a portion of the base substrate 12 that is located beneath the stressor layer and which is not covered with edge exclusion material will be removed. In some embodiments, an organic solvent such as acetone can be to remove the edge exclusion material 14 from the spalled structure.

The present application can be used in fabricating various types of thin-film devices including, but not limited to, semiconductor devices, photovoltaic devices, and electronic and optoelectronic devices that are flexible.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A method for removing a material layer from a base substrate, said method comprising:
    confining a base substrate having vertical edges within a substrate holder assembly, said substrate holder assembly comprises:
        a base structure having a surface in which said base substrate can be placed thereupon, a framing element located above and spaced apart from the surface of the base structure by a thickness of the base substrate, said framing element having a window which exposes an upper surface of the base substrate, and a support structure containing at least one mechanical securing element and located on the framing element, wherein the at least one mechanical securing element is mechanically coupled to at least one surface of the support structure;

forming a stressor layer atop the exposed surface of the base substrate; and removing a material layer of said base substrate by spalling, wherein said material layer is attached to at least said stressor layer, wherein said support structure and said framing element are removed after forming the stressor layer and prior to spalling.

2. The method of claim 1, further comprising forming an edge exclusion material on a surface of the base substrate and at each vertical edge of the base substrate prior to said confining the base substrate to said substrate holder assembly.

3. The method of claim 2, wherein after confining said base substrate to said substrate holder assembly said edge exclusion material is located directly beneath a surface of the framing element.

4. The method of claim 1, wherein said substrate holder assembly further comprises a compliant material located between the base structure and the base substrate.

5. The method of claim 4, wherein said compliant layer comprises an elastomer having a Young's modulus less than a Young's modulus of the support structure.

6. The method of claim 1, further comprising forming a handle substrate on the exposed surface of the stressor layer.

7. The method of claim 6, wherein said spalling is performed at room temperature.

8. The method of claim 7, wherein said spalling comprises pulling or peeling the handle substrate.

9. The method of claim 1, further comprising removing at least said stressor layer from said material layer.

10. The method of claim 1, wherein said support structure is a vacuum chuck containing a plurality of vacuum through holes or an electrostatic chuck.

11. The method of claim 1, wherein said framing element comprises a stainless steel sheet or a conductive elastomer.

12. The method of claim 11, wherein said conductive elastomer is anisotropically conductive.

13. A method for removing a material layer from a base substrate, said method comprising:

confining a base substrate having vertical edges within a substrate holder assembly, said substrate holder assembly comprises:

a base structure having a surface in which said base substrate can be placed thereupon, a framing element located above and spaced apart from the surface of the base structure by a thickness of the base substrate, said framing element having a window which exposes an upper surface of the base substrate, and a support structure containing at least one mechanical securing element and located on the framing element, wherein the at least one mechanical securing element is mechanically coupled to at least one surface of the support structure;

forming a stressor layer atop the exposed surface of the base substrate; and removing a material layer of said base substrate by spalling, wherein said material layer is attached to at least said stressor layer, and wherein said support structure, said framing element, and said base structure are removed after spalling.

14. The method of claim 1, wherein said at least one mechanical securing element comprises a screw, a clamp, a magnetic, or a pressure based securing element.

15. A method for removing a material layer from a base substrate, said method comprising:

confining a base substrate having vertical edges within a substrate holder assembly, said substrate holder assembly comprises:

a base structure having a surface in which said base substrate can be placed thereupon, a framing element located above and spaced apart from the surface of the base structure by a thickness of the base substrate, said framing element having a window which exposes an upper surface of the base substrate, and a support structure containing at least one mechanical securing element and located on the framing element, wherein the at least one mechanical securing element is mechanically coupled to at least one surface of the support structure, wherein a compliant material is located between the base structure and the base substrate;

forming a stressor layer atop the exposed surface of the base substrate; and removing a material layer of said base substrate by spalling, wherein said material layer is attached to at least said stressor layer.

* * * * *